(12) United States Patent
Sedighi et al.

(10) Patent No.: US 9,712,146 B2
(45) Date of Patent: Jul. 18, 2017

(54) MIXED SIGNAL PROCESSORS

(71) Applicant: University of Notre Dame du Lac, Notre Dame, IN (US)

(72) Inventors: Behnam Sedighi, Notre Dame, IN (US); Michael Niemier, Granger, IN (US); Xiaobo Sharon Hu, Granger, IN (US); Indranil Palit, South Bend, IN (US)

(73) Assignee: University of Notre Dame du Lac, South Bend, IN (US)

( * ) Notice: Subject to any disclaimer, the term of this patent is extended or adjusted under 35 U.S.C. 154(b) by 0 days.

(21) Appl. No.: 14/858,749

(22) Filed: Sep. 18, 2015

(65) Prior Publication Data

US 2017/0085255 A1 Mar. 23, 2017

(51) Int. Cl.
| | | |
|---|---|---|
| *H03K 5/153* | (2006.01) | |
| *H03K 5/24* | (2006.01) | |
| *H03K 3/012* | (2006.01) | |
| *H03L 7/18* | (2006.01) | |

(52) U.S. Cl.
CPC .......... *H03K 5/2472* (2013.01); *H03K 3/012* (2013.01); *H03L 7/18* (2013.01)

(58) Field of Classification Search
CPC .......... H04L 25/03038; H04L 27/2647; H04L 2025/03414; H04L 25/03057; H04B 1/1036
USPC ................................................ 327/63–65, 77
See application file for complete search history.

(56) References Cited

U.S. PATENT DOCUMENTS

| | | | |
|---|---|---|---|
| 6,184,558 B1* | 2/2001 | Kitamura et al. | 257/392 |
| 6,411,133 B1* | 6/2002 | Matsudai et al. | 327/65 |
| 2012/0008032 A1* | 1/2012 | Kurihara et al. | 348/308 |
| 2013/0057742 A1* | 3/2013 | Nakamura et al. | 348/302 |
| 2013/0182157 A1* | 7/2013 | Ono | 348/294 |
| 2014/0319325 A1* | 10/2014 | Kawahito et al. | 250/208.1 |
| 2015/0048428 A1* | 2/2015 | Cheng et al. | 257/288 |
| 2015/0249797 A1* | 9/2015 | Yui et al. | H04N 5/378 |
| 2016/0021318 A1* | 1/2016 | Lee et al. | H04N 5/363 |

* cited by examiner

*Primary Examiner* — Quan Tra
(74) *Attorney, Agent, or Firm* — Greenberg Traurig, LLP

(57) ABSTRACT

Various processor architectures for mixed signal computation exploit the unique characteristics of advanced CMOS technologies, such as fin-based, multi-gate field effect transistors, and/or emerging technologies such as tunnel field effect transistors (TFETs). The example processors disclosed herein are cellular neural network (CNN)-inspired and eliminate the need for voltage controlled current sources (VCCSs), which have previously been utilized to realize feedback and feed-forward templates in CNNs and are the dominant source of power consumption in a CNN array. The example processors replace VCCSs with comparators, which can be efficiently realized with TFETs given their high intrinsic gain. Power efficiencies are in the order of 10,000 giga-operations per second per Watt (GOPS/W), which represents an improvement of more than ten times over state-of-the-art architectures seeking to accomplish similar information processing tasks.

17 Claims, 22 Drawing Sheets

MIXED SIGNAL PROCESSORS

GOVERNMENT LICENSE RIGHTS

This invention was made with government support under HR0011-13-30002 awarded by Defense Advanced Research Projects Agency (DARPA). The government has certain rights in the invention.

FIELD OF THE DISCLOSURE

The present disclosure relates generally to mixed signal processors.

BACKGROUND OF RELATED ART

Devices have been investigated for extending the performance trends that have long been associated with Moore's Law-based device scaling. Among the emerging devices that have been investigated, tunnel field-effect transistors (TFETs) are a promising candidate for realizing energy efficient digital circuits in the post-complementary metal-oxide semiconductor (CMOS) era, especially when targeting low power systems. At low supply voltages, digital circuits based largely on TFETs have a better energy efficiency compared to conventional CMOS designs. Moreover, the on-current ($I_{on}$) to off-current ($I_{off}$) ratio of TFETs can be made relatively large. Likewise, subthreshold swings as low as 21 mV/dec have been observed experimentally in TFETs. TFETS can also provide excellent saturation behavior, which in many cases is important for the design of analog circuits. Researchers have also considered how the higher transconductance ($g_m$) to drain current ($I_D$) ratios of TFETs in the subthreshold region could be employed to design low-power amplifiers. More recently, researchers have also begun to consider radiofrequency (RF)-powered systems based on TFETs. However, there remains a need for leveraging TFETs in analog/mixed-signal computation.

DETAILED DESCRIPTION

Figure 1:
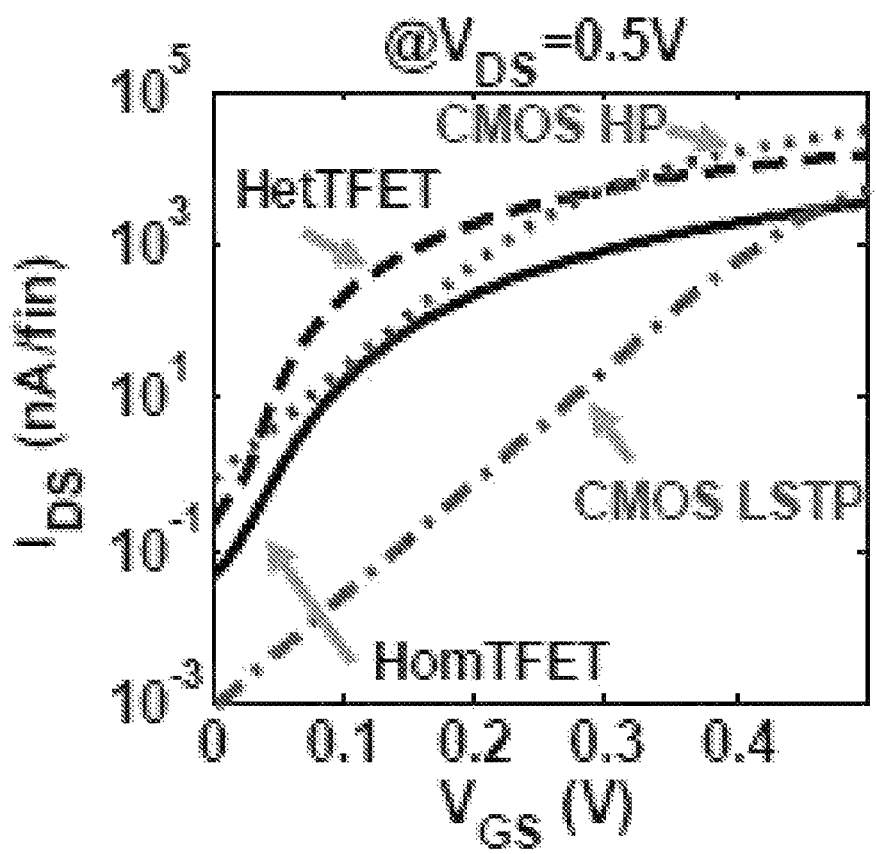
FIG. 1 is a plot showing I-V characteristics of a homo-junction TFET (HomTFET), a hetero-junction TFET (HetTFET), a complementary metal-oxide semiconductor (CMOS) low-standby power (LSTP) transistor, and a CMOS high-performance (HP) transistor, where $V_{DS}$ is equal to 0.5 V.

The following description of example apparatus is not intended to limit the scope of the description to the precise form or forms detailed herein. Instead, the following description is intended to be illustrative so that others may follow its teachings.

Processors may be utilized to pre-process and/or condition analog signals and output digital signals. In many applications, pre-processing is critical to reducing the amount of data forwarded to digital processors, and hence overall system energy consumption. The highly-parallel processing platforms of the present disclosure may, in some examples, be similar to single-instruction-multiple-data (SIMD) processors, cellular neural networks (CNNs), or vision chips, for instance. In some examples, signal processing may be performed at least partially in the time-domain to better leverage properties unique to TFETs, such as, for example, steep slopes (high $g_m/I_{DS}$) in the subthreshold region of an I-V curve and high output resistance in the saturation region of an I-V curve.

The present disclosure highlights mega-operations per cell (MOPS) as a measure of performance efficiency, and giga-operations per second per Watt (GOPS/W) as a measure of power efficiency, where in both instances higher numbers are desirable. In examples involving an indium-arsenide (InAs) TFET with feature sizes comparable to a 14 nanometer (nm) technology node, a power efficiency of 10,000 GOPS/W is obtainable. By way of comparison, state-of-the-art CMOS-based technology delivers a power efficiency near 1,000 GOPS/W.

The example processors disclosed herein differ fundamentally from prior efforts, which have focused mainly on duplicating the functionality of existing hardware, such as, for instance, static random-access memory (SRAM) or multi-core architectures. The example processors here were inspired by CNNs and eliminate the need for voltage controlled current sources (VCCSs). VCCSs have traditionally been used to realize feedback and feed-forward templates in CNNs and are typically the dominant source of power consumption in a CNN array. Rather, in the disclosed processors, VCCSs are replaced with comparators, which can be efficiently realized with TFETs given their high intrinsic gain. Power efficiencies are in the order of 10,000 GOPS/W, which represents an improvement of more than ten times over recent architectures utilizing metal-oxide-semiconductor field-effect transistors (MOSFETs) and/or fin-based, multi-gate field effect transistor (FinFET) technology that seeks to accomplish similar information processing tasks.

One example task of a processor involves determining weighted sums of analog inputs, a task at the heart of many signal processing circuits, such as CNNs, for instance. The example processors can simultaneously perform analog computation and analog-to-digital conversion. In some examples, input voltages are converted to pulse-widths, and pulse widths are measured with the aid of a high frequency clock. Moreover, in some cases an offset cancellation scheme may be employed with the processor to address the impact of device variations that have been ignored in prior efforts. Still further, differential measurements of pulse-width may also be employed to significantly reduce the signal activity of counters that are employed in the processor for purposes of quantitatively determining a weighted sum of inputs, and to lower energy dissipation. Finally, an example methodology is disclosed for adjusting the weight of different inputs in the desired weighted sum using a direct-digital frequency synthesizer.

As a preliminary matter, one example type of CNN architecture, as described in "Cellular Neural Networks: Theory," authored by L. Chua and L. Yang and published in IEEE TCAS, 35(10) at p. 1257-72 (1988), which is hereby incorporated by reference in its entirety, is an M×N array of identical cells where each cell has identical synaptic connections with all the adjacent cells in a predefined neighborhood N. Typically, the neighborhood N includes only the immediate neighbors. An example cell of a CNN may include one resistor, one capacitor, a number of linear VCCSs, one fixed current source, and one non-linear voltage controlled voltage source. Node voltages $u_{ij}$, $x_{ij}$, and $y_{ij}$ may correspond, respectively, to input, state, and output of a given cell $C_{ij}$. The input and output voltages of each neighboring cell may contribute a feedback and a control current to a given cell via VCCSs, thereby affecting the cell state x. The dynamics of the cell $C_{ij}$ can be expressed as follows:

$$C\frac{dx_{ij}(t)}{dt} = -\frac{x_{ij}(t)}{R} + \sum_{C_{kl}\in N_{ij}} a_{ij,kl}y_{kl}(t) + \sum_{C_{kl}\in N_{ij}} b_{ij,kl}u_{kl} + Z. \quad \text{(Eq. 1)}$$

To ensure fixed binary outputs, a cell in a CNN typically employs a non-linear sigmoid-like transfer function at the output, such as the following:

$$y_{ij}(t) = \frac{1}{2}(|x_{ij}(t)+1| - |x_{ij}(t)-1|). \quad \text{(Eq. 2)}$$

The parameters $a_{ij,kl}$ and $b_{ij,kl}$ may act as weights for the feedback and control currents from a cell $C_{kl}$ to a cell $C_{ij}$. Due to their space invariant nature, the parameters $a_{ij,kl}$ and $b_{ij,kl}$ are frequently denoted by two 3×3 matrices, namely a feedback template A and a control template B. By setting the values of the feedback template A, the control template B, and a constant Z, a wide range of problems may be solved. As disclosed below, the example processors may include some of the characteristics of the CNN described above.

Further, the processors may in some examples include one or more homo-junction TFETs (HomTFETs). In some cases, source materials for the HomTFETs may include without limitation indium-arsenide (InAs). One example HomTFET is described in "Comparison of Performance, Switching Energy and Process Variations for the MET and MOSFET in Logic," authored by U. E. Avci, et al., and published in VLSI Symp. Tech. Dig. at p. 124-25 (2011), which is hereby incorporated by reference in its entirety. In other examples, hetero-junction TFETs (HetTFETs) can be used in the alternative or in addition to HomTFETs. One example HetTFET involves a higher-$I_{on}$ version of a gallium-antimony indium-arsenide (GaSb—InAs) HetTFET described in "Novel Gate-recessed Vertical InAs/GaSb TFETs with Record High Ion of 180 A/m at VDS=0.5 V" authored by G. Thou, et al., and published in IEEE Int. Electron Devices Meeting (IEDM), 10-13 at p. 32.6.1-32.6.4 (December 2012), which is hereby incorporated by reference in its entirety.

With respect to FIG. 1, current ($I_{DS}$)-voltage ($V_{GS}$) curves for the InAs HomTFET and the GaSb—InAs HetTFET are plotted against $I_{DS}$-$V_{GS}$ curves for a CMOS high-performance (HP) transistor and a CMOS low-standby power (LSTP) transistor. The $I_{DS}$-$V_{GS}$ curves illustrate the "steep slopes" of the TFETs. FIG. 1 shows that a leakage current of the HomTFET, which is the value of $I_{DS}$ when $V_{GS}$ is zero, is between leakage currents for the CMOS HP and CMOS LSTP transistors. Those having ordinary skill in the art will recognize that the HomTFET has a higher current drive than the CMOS LSTP transistor for a $V_{DD}$ smaller than 0.4 V when $V_{DS}$ equals 0.5 V. Therefore, digital circuits based primarily on TFETs are faster at least in the context of these supply voltages.

Figure 2:
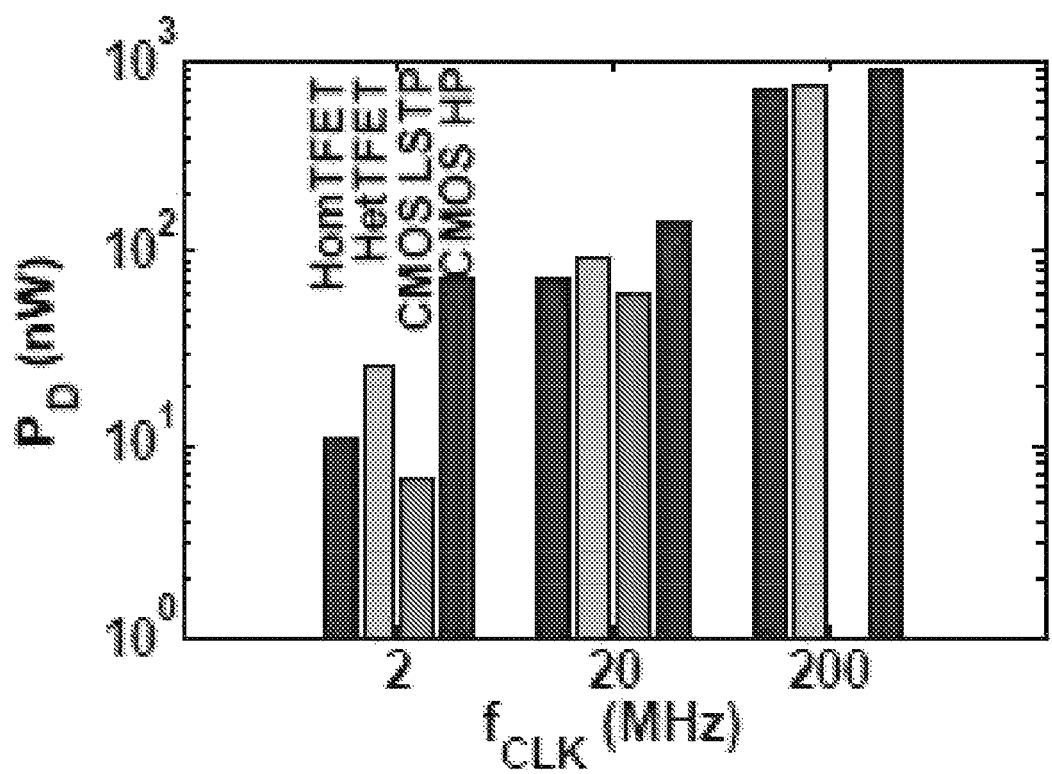
FIG. 2 is a chart showing power dissipation where $V_{DD}$ equals 0.4 V for various clock frequencies of an 8-bit counter used in connection with each of a HomTFET, a HetTFET, a CMOS LSTP transistor, and a CMOS HP transistor.

The example processors may also include digital counters, such as an 8-bit counter, for example. FIG. 2 shows power dissipation of 8-bit counters based, respectively, on HomTFETs, HetTFETs, CMOS LSTP transistors, and CMOS HP transistors, for a supply voltage $V_{DD}$ of 0.4 V and for clock frequencies $f_{CLK}$ of 2, 20, and 200 MHz. As shown in FIG. 2, for HetTFET- and CMOS HP-based counters where the supply voltage $V_{DD}$ equals 0.4 V, the leakage current becomes dominant at frequencies $f_{CLK}$ below 2 MHz. Those having ordinary skill in the art will recognize that the CMOS LSTP-based counter does not work at 200 MHz. While clock frequencies $f_{CLK}$ of approximately 100

Figure 3:
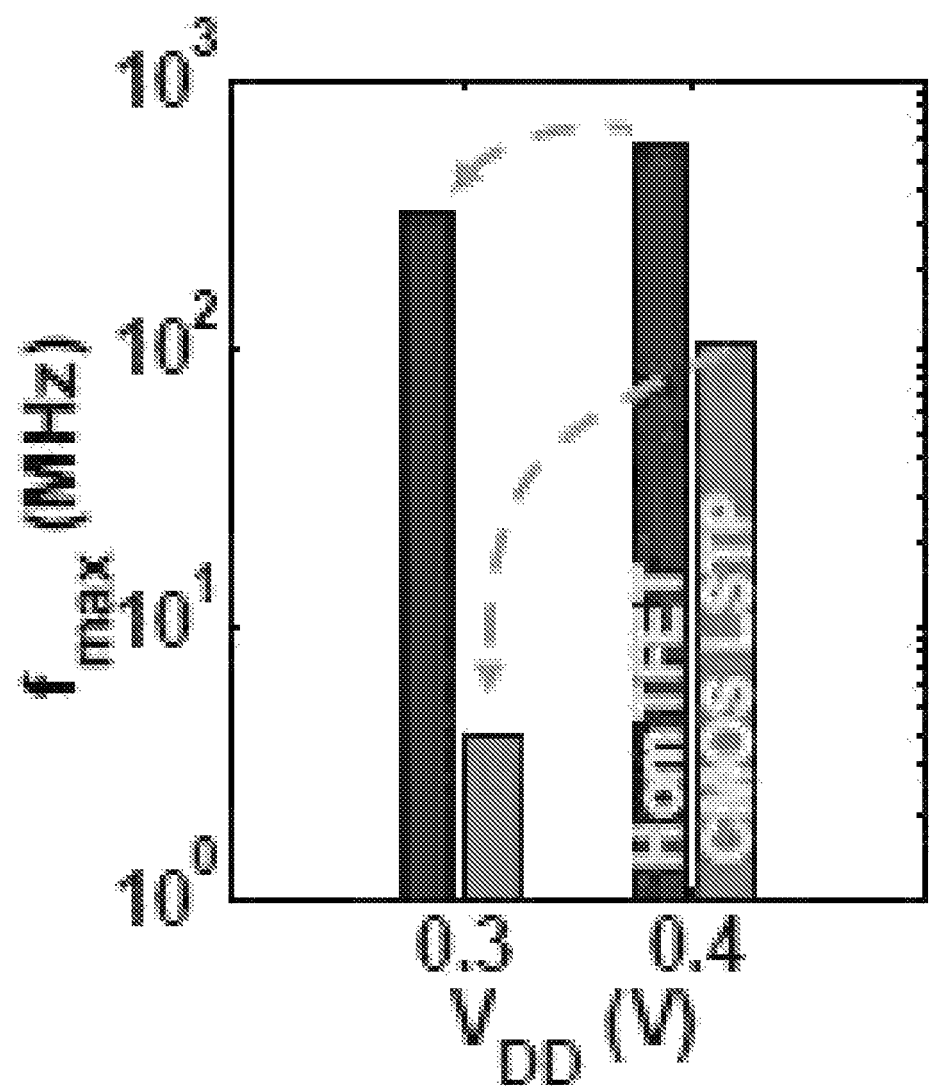
FIG. 3 is a chart showing maximum clock frequencies for a CMOS LSTP transistor and a HomTFET at two different voltages in the subthreshold region.

MHz are of interest, acceptable effective clock rates $f_{CLK}$ can be as low as just a few MHz as clock gating is utilized. Thus, the HomTFET-based and CMOS LSTP-based counters are more desirable than the HetTFET-based and CMOS HP-based counters due to their lower leakage currents. And because CMOS LSTP transistors work in the subthreshold region when $V_{DD}$<0.4 V, device speed is exponentially affected by the supply voltage $V_{DD}$. For instance, if the supply voltage $V_{DD}$ is reduced from 0.4 V to 0.3 V as shown in FIG. 3, a maximum operating frequency $f_{max}$ of the CMOS LSTP-based counter is reduced by more than twenty times. In contrast, when the supply voltage $V_{DD}$ of the HomTFET-based counter is reduced from 0.4 V to 0.3 V, the maximum clock frequency $f_{max}$ remains above 300 MHz, which shows that a HomTFET-based counter is robust with respect to process/voltage/temperature (PVT) variations. Accordingly, at least some digital circuits referenced herein may utilize HomTFETs with supply voltages $V_{DD}$ of 0.4 V.

Figure 4:
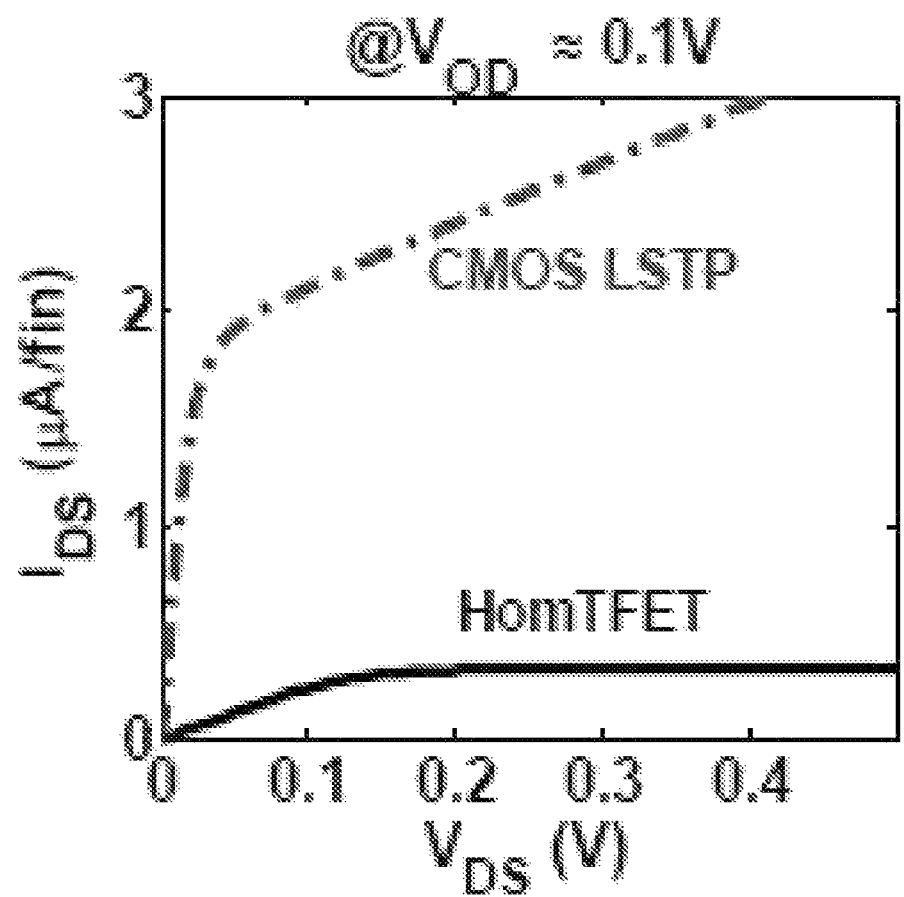
FIG. 4 is a plot showing I-V characteristics of a CMOS LSTP transistor and a HomTFET where $V_{OD}$ equals 0.1 V.

A threshold voltage of a HomTFET needed to create a conducting path between source and drain terminals is 120 mV, which is ideal for low-voltage analog circuits. Moreover, if TFETs are biased in the subthreshold region, they present a higher transconductance ($g_m$) than a MOSFET biased at a similar drain current because of the steep $I_{DS}/V_{GS}$ slope of TFETs. Another advantage of using HomTFETs for analog circuit design is higher output resistance (i.e., constant current $I_{DS}$ in the saturation region), as shown in FIG. 4. In turn, amplifiers based primarily on HomTFETs will have higher intrinsic voltage gain.

As noted above, cells of conventional CNNs typically include VCCSs, which may be implemented by way of operational transconductance amplifiers. Such VCCSs, however, suffer from several non-ideal effects. For example, mismatches in transistor parameters (e.g., attributable to rough edges or material imperfections) introduce offsets and prevent well-defined gains in a VCCS. Mismatches and process variation are exacerbated in deep-sub-micron technologies. At small supply voltages, moreover, it is difficult to make circuits linear across a large input range.

TFETs allow for the possibility of building high-gain amplifiers, and one example of an excellent high-gain amplifier is a comparator. The non-ideal effects in a comparator cause input-referred offset ($V_{offset}$). Yet because gain error and nonlinearity are not relevant in a comparator, any resultant device is more robust.

The example processors of the present disclosure generally use comparators in the place of VCCSs. Transistors foster the design of a comparator because of the high intrinsic gain of transistors. Power dissipation of the comparator is lower than its CMOS-based equivalent because the input differential pair of the comparator may be biased in the subthreshold region of an I-V curve where TFETs have a higher transconductance-to-current ratio $g_m/I_{DS}$. Finally, additional processing tasks can be transferred to the digital domain, where robust, low-voltage circuits may be employed due to the low threshold voltages of TFETs.

Those having ordinary skill in the art will appreciate that the proposed architecture is not limited to HomTFETs or even TFETs. The disclosed processor architecture can also be implemented with, for example, CMOS technology.

Figure 5:
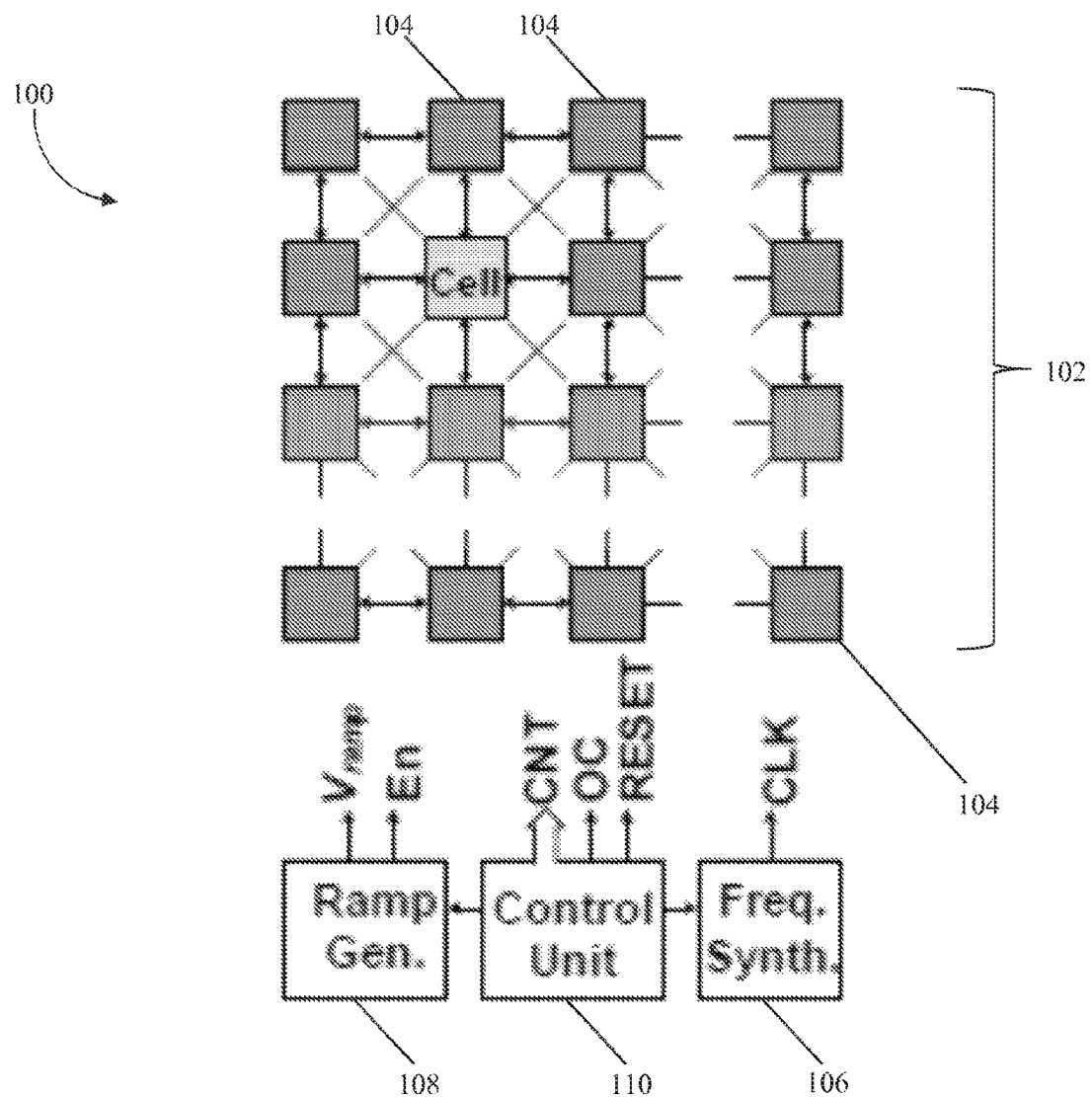
FIG. 5 is a schematic view of an example processor.

With reference now to FIG. 5, an example processor 100 may in some examples include a homogeneous array 102 of processing cells 104. Each cell 104 may receive an analog input, communicate with neighboring cells, and produce a digital output. An example frequency synthesizer 106 may, amongst other things, generate a variable clock frequency. An example ramp generator 108 may, amongst other things, generate and apply a ramp signal to all cells 104. An example control unit 110 may, amongst other things, set the frequency of the frequency synthesizer 106, start and stop the ramp generator 108, and/or apply proper settings to all cells 104. To keep the size of the cells 104 as compact as possible, in some examples multipliers and adders are omitted from the cells 104.

Figure 6:
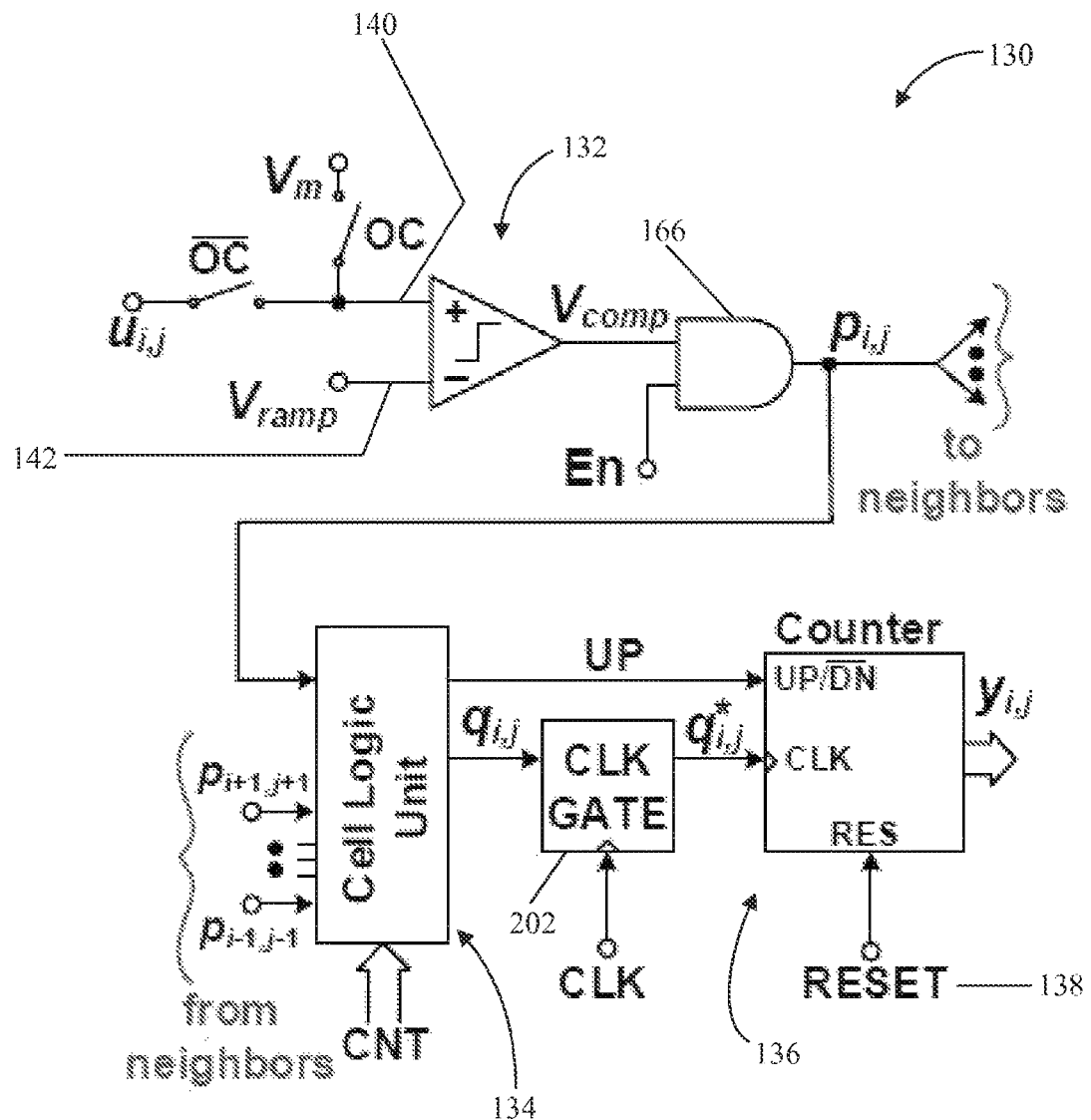
FIG. 6 is a circuit diagram of an example cell that may be utilized in the example processor of FIG. 5.

As shown in FIG. 6, one or more of the cells 104 from the processor 100 may have an example cell architecture 130 that includes three main components: a comparator 132, a cell logic unit (or "small logic block") 134, and a gated counter 136. The counter 136 may initially be reset by the control unit 110 using a RESET signal 138. In one example, an input 140 of the comparator 132 may be connected to either an input voltage $u_{i,j}$ or a reference voltage $V_m$. The reference voltage $V_m$ may represent a minimum input value, a maximum input value, or a mid-level input value and may also be shared by all the cells 104. A voltage ramp $V_{ramp}$ generated by the ramp generator 108 shown in FIG. 5 may be applied in a recurring manner to another input 142 of the comparator 132. The voltage ramp $V_{ramp}$ may in some cases be shared by all comparators in the array 102 of the processing cells 104. Further, at least in some examples, a slope $s_{ramp}$ of the voltage ramp $V_{ramp}$ does not change during operation.

Figure 7:
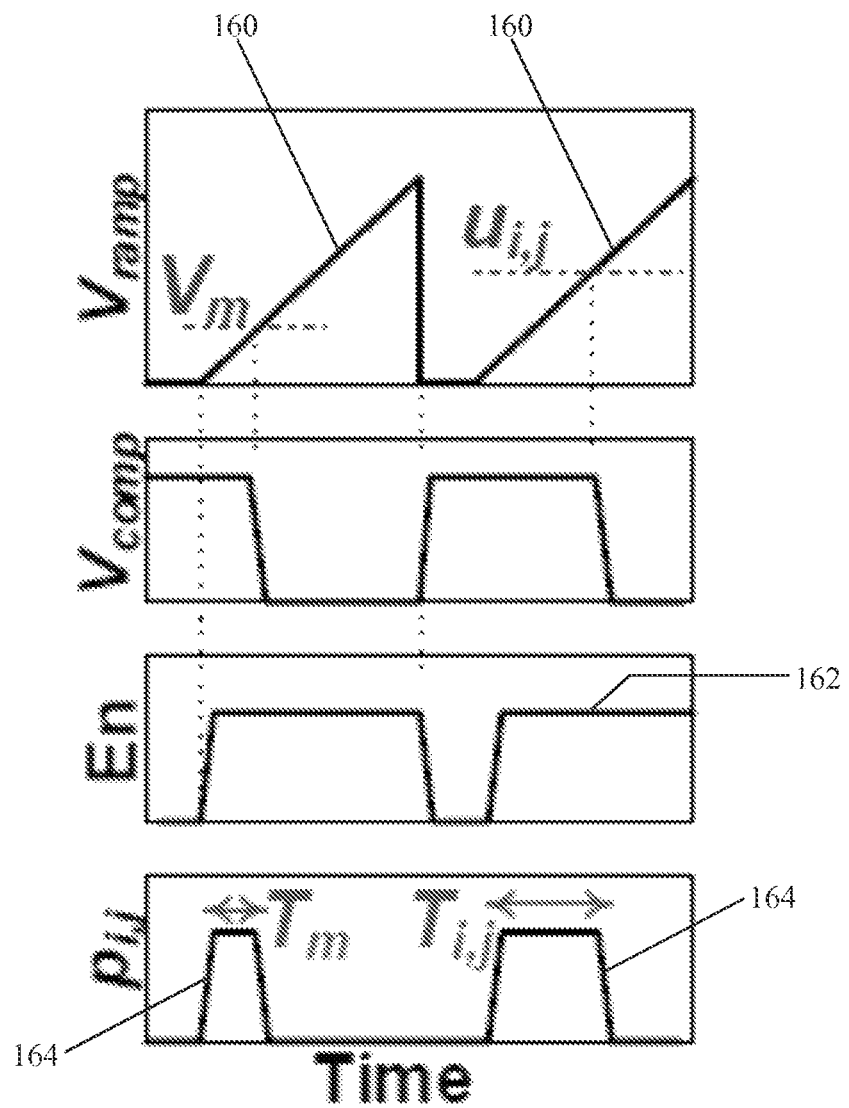
FIG. 7 includes several plots that graphically depict voltage to pulse-width conversion in the example processor of FIG. 5.

With reference now to FIG. 7, the comparator 132 may be connected to the input voltage $u_{i,j}$ or the reference voltage $V_m$ in two consecutive ramp cycles. Each time a ramp 160 is applied, a logic signal $E_n$ may be set to a high-level 162 by the ramp-generation circuitry 108. When both the logic signal $E_n$ and an output voltage of the comparator $V_{comp}$ are high, the ramp may be considered active, and the voltage ramp $V_{ramp}$ is smaller than the input (i.e., the reference voltage $V_m$ or the input voltage $u_{i,j}$) to the comparator 132. During this time, a signal $p_{i,j}$ will be high. In turn, at each ramp cycle, pulses 164 are generated in the signal $p_{i,j}$, the width of which carries information about the magnitude of the input to the comparator 132.

Alternating input to the example comparator 132 between the reference voltage $V_m$ and the input voltage $u_{i,j}$ may serve as an offset-cancellation mechanism. A signal OC generated by the control unit 110 may determine which input (i.e., the reference voltage $V_m$ or the input voltage $u_{i,j}$) is supplied to the comparator 132. Those having ordinary skill in the art may consider an example where the comparator 132 has an offset voltage $V_{offset}$ with a fixed timing skew $T_{skew}$ between the logic signal $E_n$ and the output voltage of the comparator $V_{comp}$. The fixed timing skew $T_{skew}$ may be caused by, for instance, the delay of the comparator 132, digital circuits, or inter-cell wirings. In this example, one having ordinary skill in the art may further consider that the difference between the rise and fall times of an AND gate 166 (FIG. 6) that follows the comparator 132 can be represented as $\Delta T_{rf}$. When the reference voltage $V_m$ is applied to the comparator 132, a pulse-width $T_m$ of the signal $p_{i,j}$ can be determined as follows:

$$T_m = (V_m + V_{offset})/s_{ramp} + T_{skew} + \Delta T_{rf}/2. \quad \text{(Eq. 3)}$$

where $s_{ramp}$ is the slope of the ramp signal $V_{ramp}$ in Volts per second. Similarly, when the input voltage $u_{i,j}$ is applied to the comparator 132, the pulse-width $T_{i,j}$ of the signal $p_{i,j}$ can be determined as follows:

$$T_{i,j} = (u_{i,j} + V_{offset})/s_{ramp} + T_{skew} + \Delta T_{rf}/2. \quad \text{(Eq. 4)}$$

Those having ordinary skill in the art will understand that the difference between the pulse widths $T_{i,j}$ and $T_m$ can then be determined as follows:

$$\Delta T_{i,j} = T_{i,j} - T_m = (u_{i,j} - V_m)/s_{ramp}. \quad \text{(Eq. 5)}$$

Likewise, it should be understood that the offset voltage $V_{offset}$ and the timing skew $T_{skew}$ do not necessarily affect the difference $\Delta T_{i,j}$ between the pulse widths $T_{i,j}$ and $T_m$. Moreover, low frequency noise (i.e., the flicker noise) of the comparator 132 may be diminished where the noise frequency is much smaller than the ramp frequency.

Figure 8:
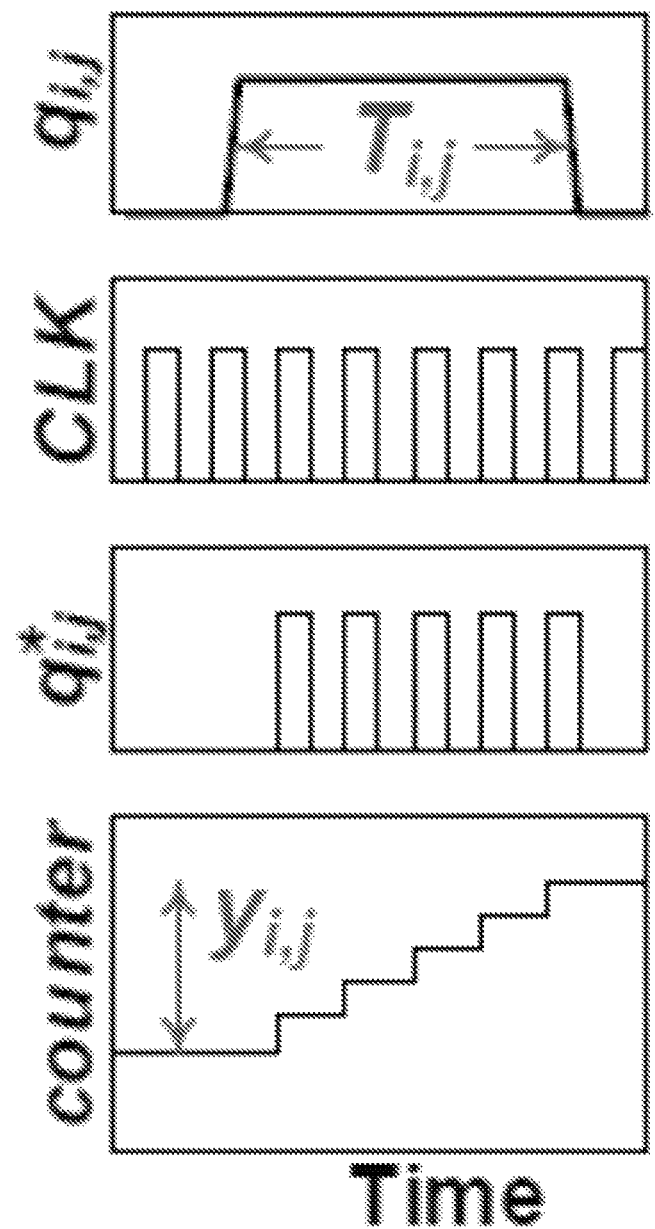
FIG. 8 includes several plots that graphically depict one example way in which a counter of the example processor of FIG. 5 can measure pulse-width.

The next step may involve determining the difference $\Delta T_{i,j}$ between the pulse widths $T_{i,j}$ and $T_m$. For purposes of this example, the cell logic unit 134 may be said to pass an input pulse $p_{i,j}$ directly to an output $q_{i,j}$ such that the output $q_{i,j}$ equals the input pulse $p_{i,j}$. Because the output $q_{i,j}$ may be used to gate a clock signal CLK as shown in FIG. 8, a counter output value may change by $y_m = T_m/T_{CLK}$ and $y_{i,j} = T_{i,j}/T_{CLK}$ during the two subsequent ramp cycles. Put another way, a clock period $T_{CLK}$ may be equal to $1/f_{CLK}$. Furthermore, the direction of counting may be reversed using a signal UP, which can be generated by the control unit 110. If the counter 136 counts down during a first ramp cycle and counts up in a second ramp cycle, a final change $\Delta y_{i,j}$ in the counter output value $y_{i,j}$ may be represented as follows:

$$\Delta y_{i,j} = (u_{i,j} - V_m) f_{CLK}/s_{ramp}. \quad (Eq. 6)$$

In some examples, the final change $\Delta y_{i,j}$ in the counter output value $y_{i,j}$ may serve as a digital representation of the difference between the reference voltage $V_m$ and the input voltage $u_{i,j}$, as may be amplified or attenuated by a weighting factor $w = f_{CLK}/s_{ramp}$. To that end, the weighting factor w may be adjusted in some cases by altering either the clock frequency or the slope $s_{ramp}$ of the ramp $V_{ramp}$, as described in "A smart CMOS imager with pixel level PWM signal processing" authored by M. Nagata, et al., and published in VLSI Symp. Tech. Dig. at p. 141-44 (1999), which is hereby incorporated by reference in its entirety. Altering the slope $s_{ramp}$ of the ramp $V_{ramp}$ may require a digital-to-analog converter (DAC) in the ramp generator 108, whereas altering the clock frequency $f_{CLK}$ may require a frequency synthesizer. In some examples, to set the clock frequency $f_{CLK}$, the example processor 100 utilizes a direct-digital frequency synthesizer (DDS), which may be shared by all cells 104. The DDS may be fully-digital, robust, and scalable. And the overhead of having the DDS with respect to the total area and power dissipation of a chip supporting the processor 100 is small, especially in examples where the processor 100 includes a large number of cells 104.

The processor 100 may need to determine a sum of multiple inputs. Thus, in one example, summation may be performed in subsequent ramp cycles using a form of time-division multiplexing (TDM). One rationale for performing summation by TDM is that one level of parallelism already exists in the processor 100 and, because the circuitry is fast enough, internal operation of the cells 104 can be performed serially. Accordingly, the output of the comparator $V_{comp}$ or, more precisely, the signal $p_{i,j}$ output from the AND gate 166 may first be used in one of the cells 104 in the first two ramp cycles, and then used in another neighboring cell 104 in the next two ramp cycles, and so on.

Figure 9:
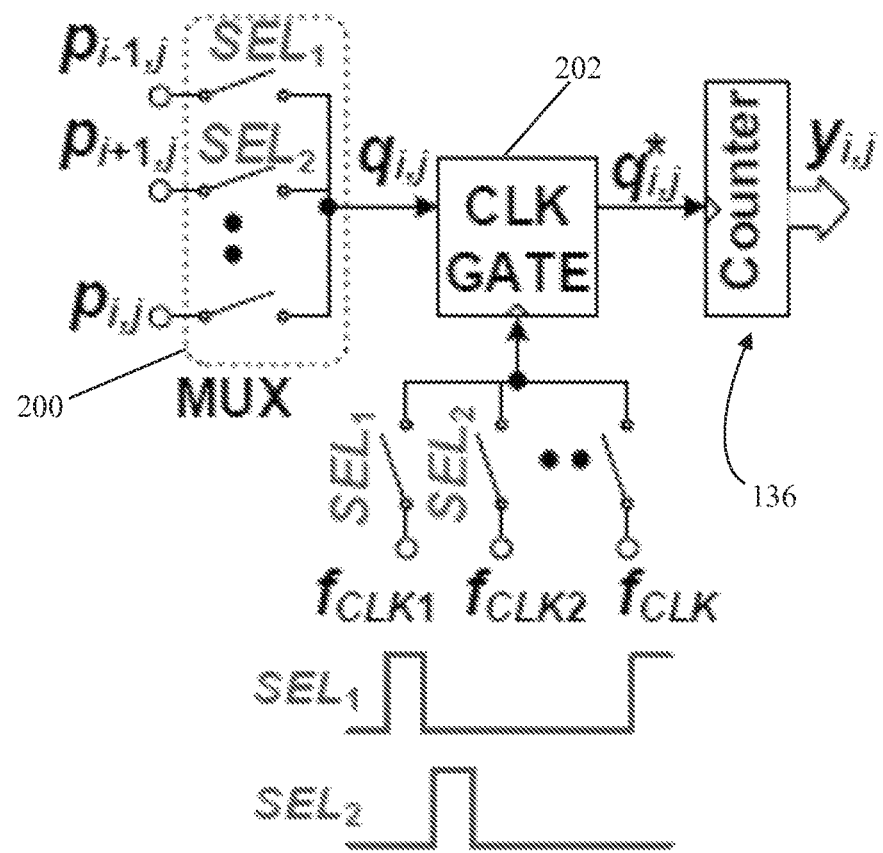
FIG. 9 generally depicts a circuit diagram of an example multiplexer, an example gate, and an example counter that may be employed to calculate a weighted sum by way of time division multiplexing (TDM) and changing a clock signal CLK, wherein two example input signals $SE_1$ and $SEL_2$ are shown beneath the circuit diagram.

FIG. 9 illustrates the TDM concept with respect to the example counter 136. In this example, different weights w translate to different clock frequencies $f_{CLK}$. Two multiplexers, including a multiplexer 200, may be used in this example to sequentially route each input pulse and its corresponding clock frequency to a clock gating circuit 202. For example, when a signal $SEL_1$ is high, a ramp may be applied to all comparators, a signal $p_{i-1,j}$ may gate a first clock frequency $f_{CLK1}$, and the counter value $y_{i,j}$ may change by $\Delta T_{i-1,j} \times f_{CLK1}$. Next, a signal $SEL_2$ may be set to high, and the process may be repeated. After pulses from all neighboring cells 104 are digitized, the counter 136 may hold a value that is equal to the weighted sum of the inputs:

$$y_{i,j} = \sum_{k,l \in N_{ij}} \frac{s_{k,l}(u_{k,l} - V_m) f_{CLK_{k,l}}}{s_{ramp}}, \quad (Eq. 7)$$

where $f_{CLK_{k,l}}$ refers to a clock frequency used for measuring each pulse width, and $N_{i,j}$ refers to the set of all neighbors of the cell in row i, column j. A sign $S_{k,l}$ of each term, which equals $\pm 1$, may be controlled by the signal UP. Those having ordinary skill in the art will understand that in some examples the multiplexer used to switch the clock frequency $f_{CLK}$ is unnecessary because the DDS may generate one frequency at a time. In other words, altering the clock frequency $f_{CLK}$ may be implemented by applying a new input to the frequency synthesizer, instead of switching the clock frequency $f_{CLK}$ as shown in FIG. 9.

Figure 10:
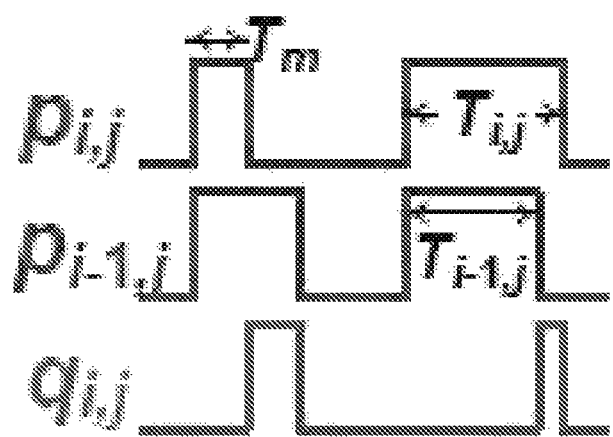
FIG. 10 is a series of plots that demonstrate an example way in which one signal $p_{i,j}$ may be subtracted from another signal $p_{i-1,j}$ in a time domain to determine a resultant signal $q_{i,j}$.
Figure 11:
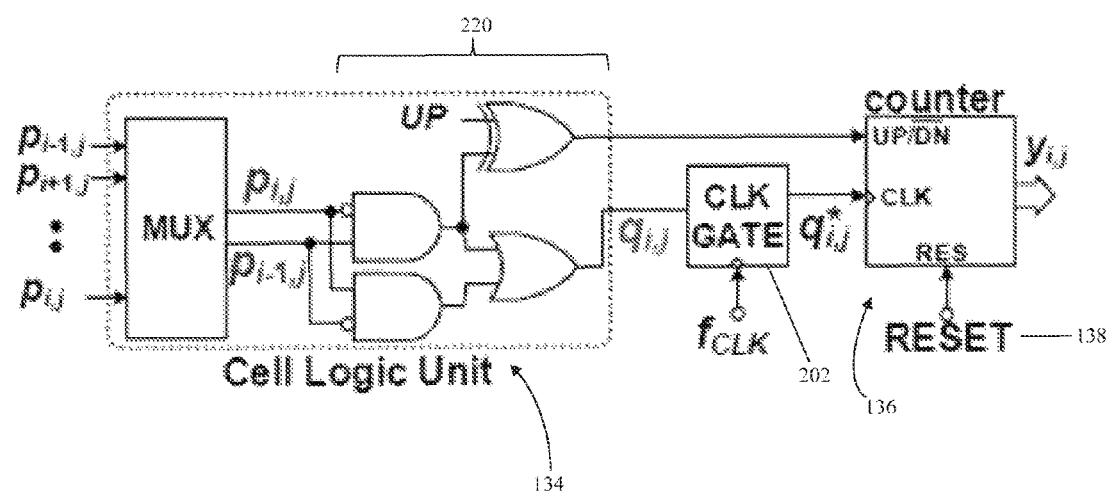
FIG. 11 is a circuit diagram of an example cell logic unit that may be employed by the cells in the example processor of FIG. 5.

Using TDM, the logic unit 134 of each cell 104 may be reduced to a multiplexer. However, those having ordinary skill in the art will recognize that the cells 104 may utilize more complicated and/or more efficient logic circuits. By way of example, in many applications the difference of two analog inputs needs to be determined. In some cases, the subtraction may be performed in a time-domain as shown in FIG. 10, such as where the pulse $p_{i,j}$ is subtracted from the pulse $p_{i-1,j}$ to result in a signal $q_{i,j}$. FIG. 11 shows how two pulses $p_{i-1,j}$ and $p_{i,j}$ can be subtracted using simple logic gates 220. A signal $w(u_{i,j} - u_{i-1,j})$, for example, may be determined in two ramp cycles as opposed to four without differential calculation. A logic circuit ensures that the clock 202 is not gated when the two pulses $p_{i,j}$ and $p_{i-1,j}$ are equal. Moreover, if the pulse $p_{i,j}$ is low and the pulse $p_{i-1,j}$ is high, the UP signal may be inverted (e.g., if an input $u_{i-1,j}$ subtracted from an input $u_{i,j}$ is less than zero, then the counting direction may be reversed).

Differential measurements improve performance by a factor of at least two in many cases. Energy efficiency may ultimately prove to be even more significant, however. In many applications, neighboring inputs are in close proximity. As merely an example, in an image the neighboring pixels will have large intensity differences only for pixels on edges. Thus, when performing differential measurement a resulting waveform $q_{i,j}$ is likely to consist of narrow pulses, and a clock may be gated for most of the time, as would be the case during the timeframe shown in FIG. 10. Instead of counting for two long time intervals, the counter may only be active (i.e., consuming dynamic power) for the difference of the two time intervals.

Figure 12:
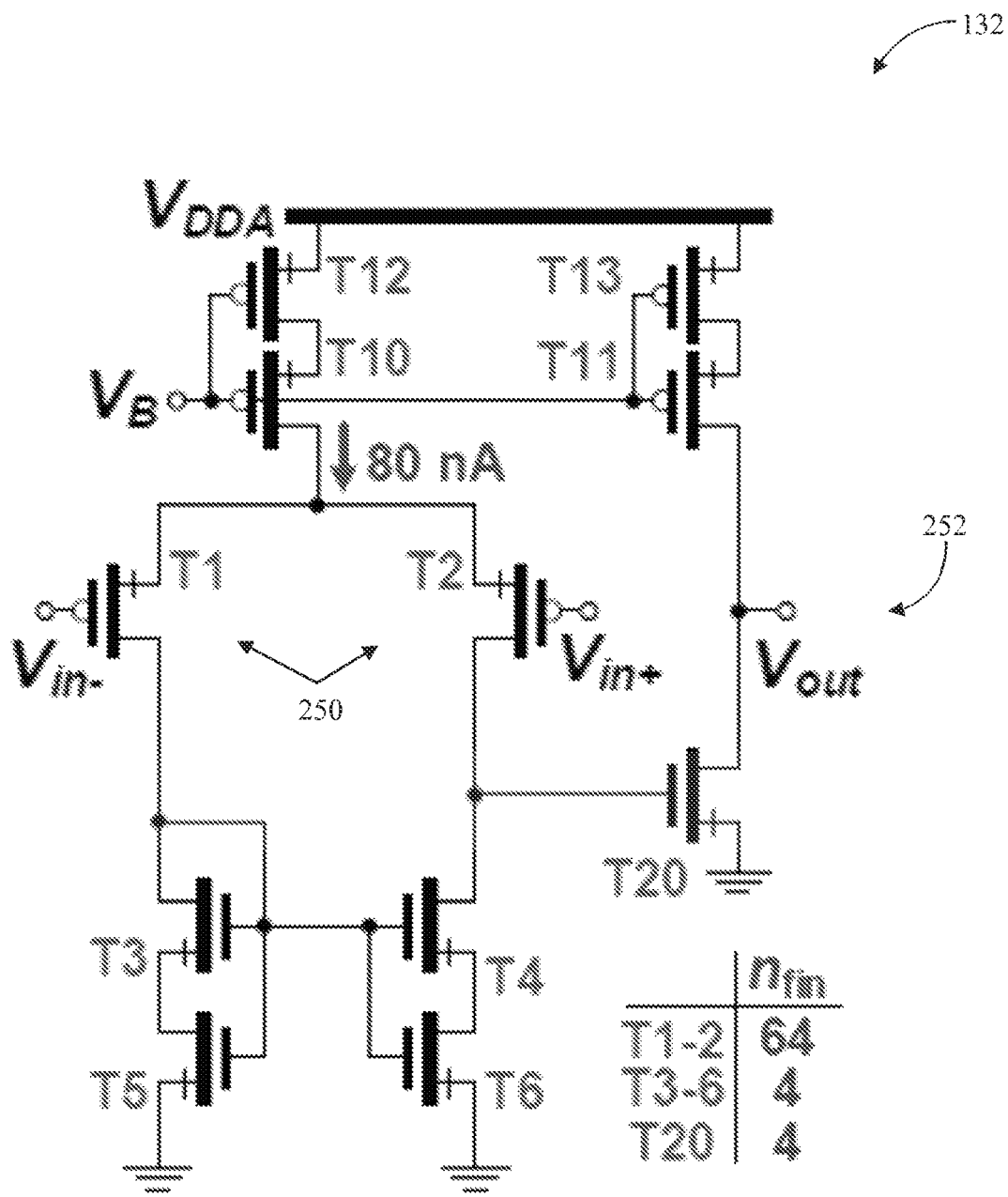
FIG. 12 is a circuit diagram of an example comparator that may be employed by the cells in the example processor of FIG. 5.

FIG. 12 is a circuit diagram of the example comparator 132. Those having ordinary skill in the art will understand that the mixed signal processing architectures disclosed herein are not in any way limited to the example comparator 132. Nevertheless, the topology of the example comparator 132 includes a differential input stage 250 and a common-source output stage 252. In one example, the comparator 132 includes a plurality of transistors T1, T2, T3, T4, T5 T6, T10, T11, T12, T13, and T20, for many of the reasons identified above. At the very least, the transistors T5, T6, T12, and T13 are not used in typical comparator topologies. To enable a current mirror with good precision, the transistors may in some examples have a large area and may also be biased in the saturation region such that near-threshold or subthreshold operation is avoided, for instance. One example way in which to increase area and bias a transistor in the saturation region is by increasing a length (L) of the transistor. Where the length L of a transistor cannot be changed, resistor degeneration may be utilized in some cases. For example, the transistor T5 may have a relatively small drain-source voltage and may operate in the ohmic region. The transistor T5 may act as resistive source degeneration for the transistor T3, which may operate in the saturation region. Resistive source degeneration lowers the total transconductance of the transistor T3-transistor T5 pair, which in turn reduces an impact of a threshold voltage mismatch on an output current of the mirrors. Those having ordinary skill in the art will appreciate that resistive source degeneration may also be employed by other pairs of transistors, such as the transistor T4-transistor T6 pair, for example.

Figure 13:
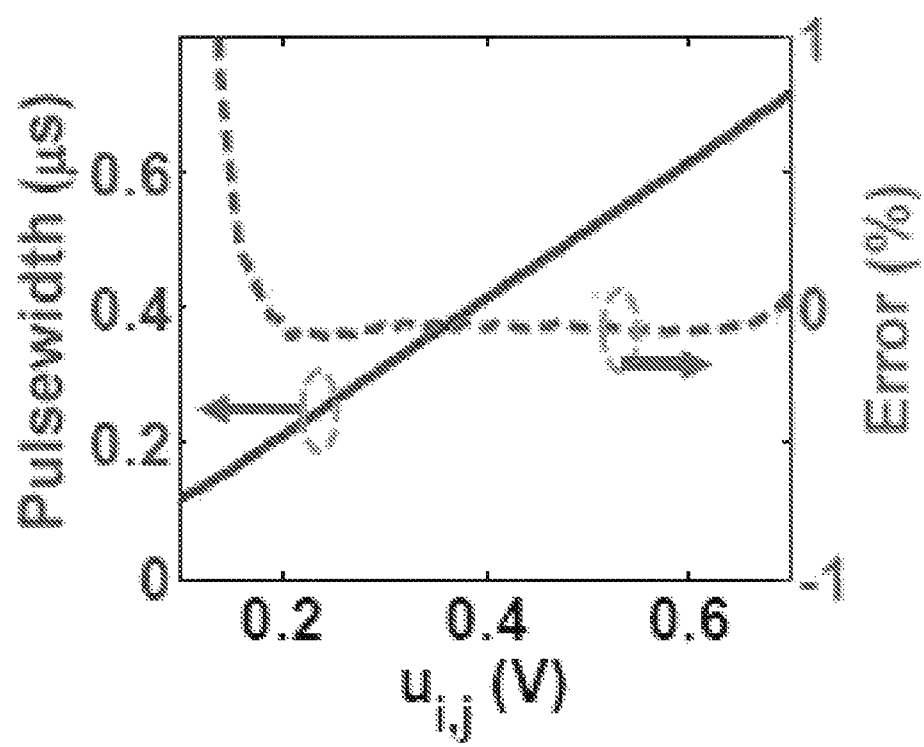
FIG. 13 is a plot showing a relationship between pulse width and input voltage of a comparator where a slope $S_{ramp}$ of a ramp signal $V_{ramp}$ is 1 Volt/μs.

In some instances, voltage-to-pulse-width conversion is linear. The relationship between pulse width and the input voltage $u_{i,j}$ where the slope $s_{ramp}$ of the ramp signal $V_{ramp}$ is 1 Volt/μs is represented in FIG. 13. For input voltages close to ground potential, the input transistors T1, T2 may go out of the saturation region. For inputs close to a supply voltage $V_{DDA}$, the transistor T10 will go out of the saturation region. Both of these phenomena may change the speed of the circuit and cause errors in some cases, but the output pulse-width remains a linear function of input voltage in large input ranges. To allow for sufficient margins, an input range of 320 mV may be employed in one example, in which case the error is below 0.2%. In that example, more than 50 mV on either side of the input range remain as buffer zones against variations caused by offset. Further to that example, the input range of 320 mV and 8-bit accuracy translates into an equivalent least-significant bit (LSB) of 1.25 mV.

Figure 14:
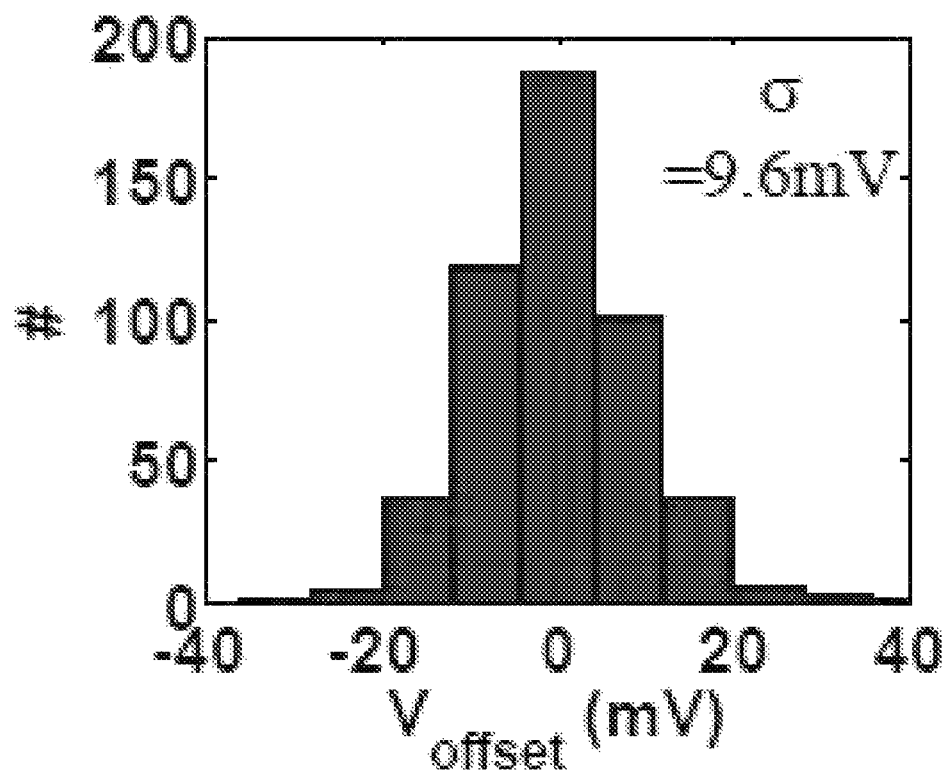
FIG. 14 is a histogram showing measured offset in the example comparator of FIG. 12 after 500 runs.

To illustrate how processor architecture relaxes the offset requirements of a comparator, mismatch coefficients of $A_{TH}$=1 mVμm and $A_{β}$=0.01 μm may be used in one example. Due to the offset cancellation scheme where one of the inputs 140 to the comparator 132 alternates between the reference voltage $V_m$ and the input voltage $u_{i,j}$, the exact value of the mismatch coefficients of $A_{TH}$ and $A_β$ is not critical. However, it may be necessary to ensure that comparator offset is not excessively large. A histogram of the measured offset $V_{offset}$ is shown in FIG. 14, which reveals that an absolute value of the offset $|V_{offset}|$ is well below 50 mV. Hence, offset does not degrade the input common-mode range of the comparator 132 and is diminished by the offset cancellation scheme.

Even with mismatches, voltage gain of the comparator 132 remains higher than 1200 V/V. With a difference between high and low output levels where $V_{DDA}/3$=0.27 V, input sensitivity of the comparator 132 is 0.22 mV. This input sensitivity is much smaller than one LSB and the gain of the example comparator 132 is sufficient for 8-bit resolution due to the high output resistance of the transistors. Measured comparisons of time and power dissipation may be 10 ns and 0.11 μW, respectively, at $V_{DDA}$=0.8 V.

Figure 15:
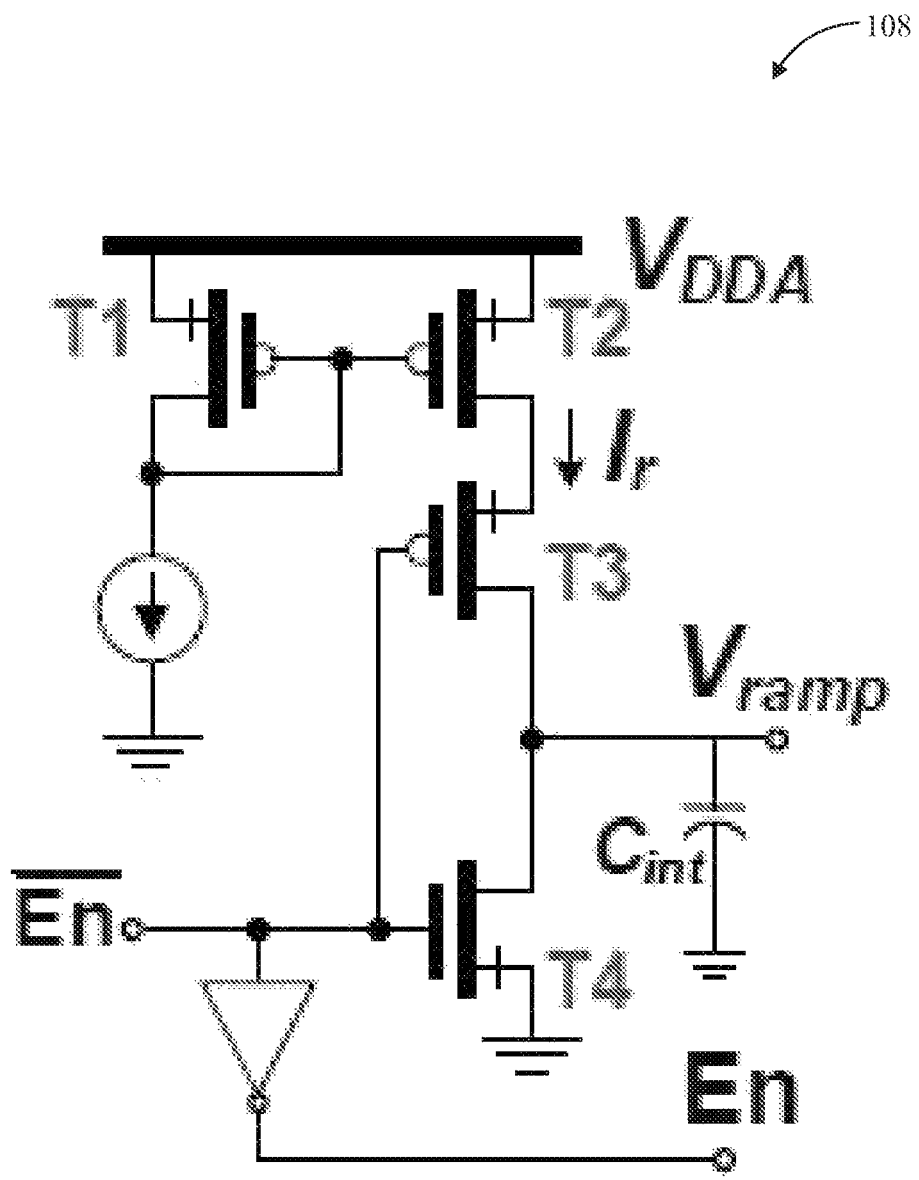
FIG. 15 is a circuit diagram showing an example ramp generator that may be employed by the example processor shown in FIG. 5.
Figure 16:
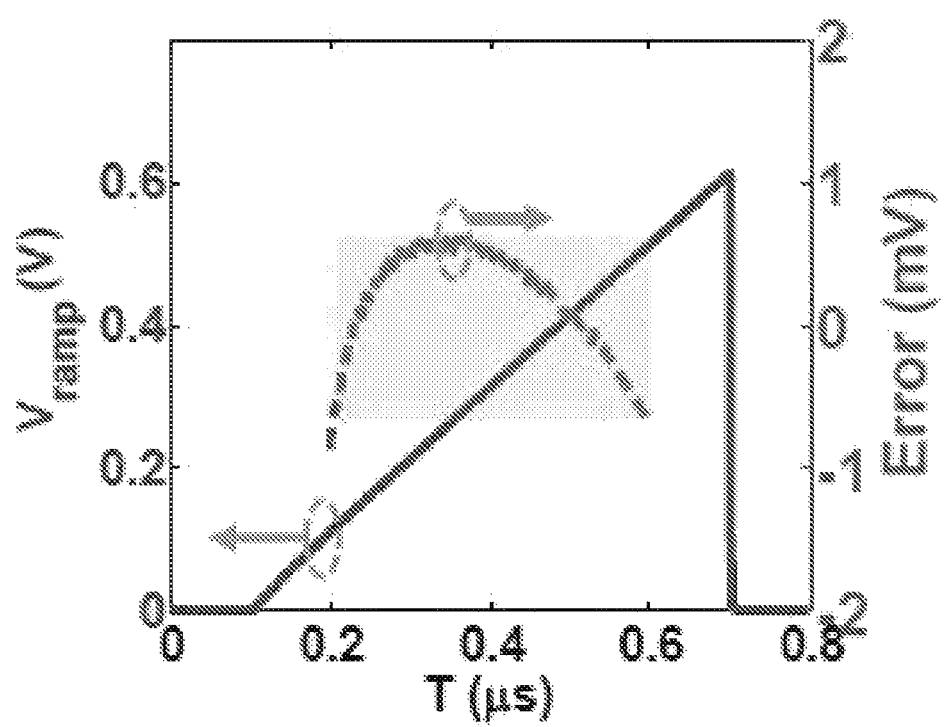
FIG. 16 is a plot of an example voltage ramp $V_{ramp}$ that may be utilized in the example processor of FIG. 5, along with error in the nonlinearity of the voltage ramp $V_{ramp}$.

Due to large transistor output resistance, the example ramp generator 108 shown in FIG. 15 may be formed at least in part by charging a capacitor $C_{int}$ by a fixed current. When the logic signal $E_n$ is high, a transistor T3 is on and a current $I_r$ may charge the capacitor $C_{int}$ generating a ramp. When the logic signal $E_n$ is low, a transistor T4 may discharge the capacitor $C_{int}$ and the voltage ramp $V_{ramp}$ will become zero. A slope $s_{ramp}$ of a voltage ramp $V_{ramp}$ in this example may be equal to the current $I_r$ divided by the value of the capacitor $C_{int}$. But the current $I_r$ may need to be adjustable so that the slope $s_{ramp}$ of the voltage ramp $V_{ramp}$ can be fine-tuned. FIG. 16 shows the example voltage ramp $V_{ramp}$. The error in the nonlinearity of the voltage ramp $V_{ramp}$, which may be caused by the finite output resistance of a transistor T2, remains below ±0.5 LSB. Those having ordinary skill in the art will appreciate that the mixed signal processing architectures disclosed herein are not in any way limited to the example ramp generator 108.

It should be understood that the capacitance of the capacitor $C_{int}$ may include parasitic capacitances of interconnects, as the voltage ramp $V_{ramp}$ may be routed to all cells 104. For instance, if there are 1000 cells 104, and each cell 104 contributes 5 fF to the capacitance of the capacitor $C_{int}$, the total capacitance will be 5 pF. The current $I_r$ may in some examples be set to 5 μA to achieve a slope $s_{ramp}$ of 1 V/μs. Hence a 0.8 V supply leads to a 4 μW power dissipation in the ramp generator 108, which may contribute 4 nW to per-cell power dissipation. As explained below, this amount of power dissipation in the ramp generator 108 is negligible compared to the amount of power dissipation of the cell itself.

Figure 17:
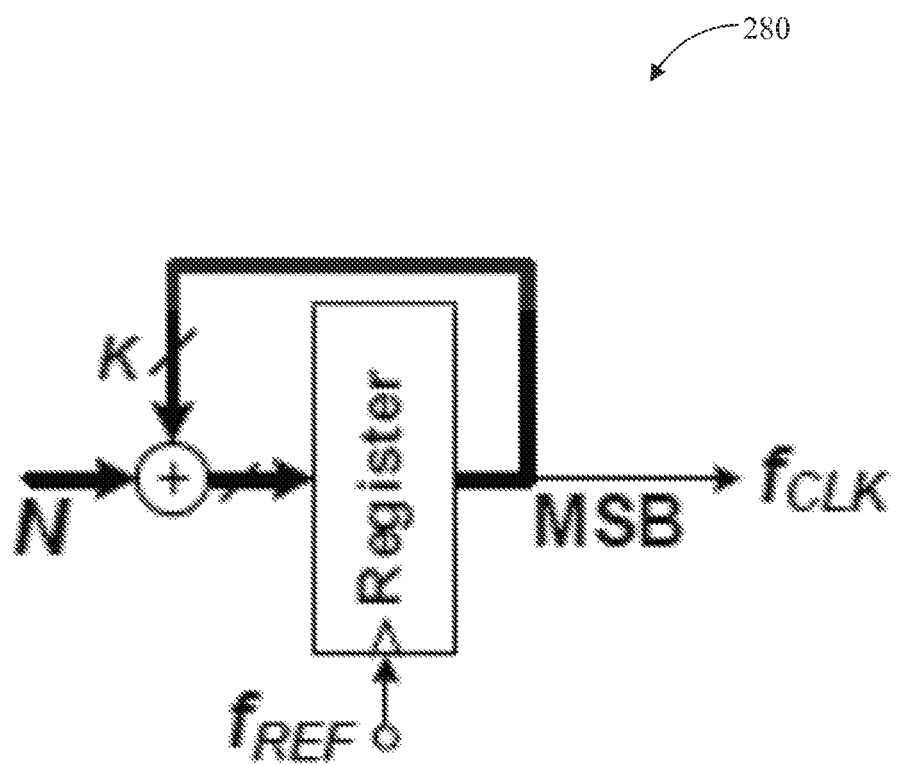
FIG. 17 is a circuit diagram of an example direct-digital frequency synthesizer (DDS) that may be employed in the example processor shown in FIG. 5.
Figure 18:
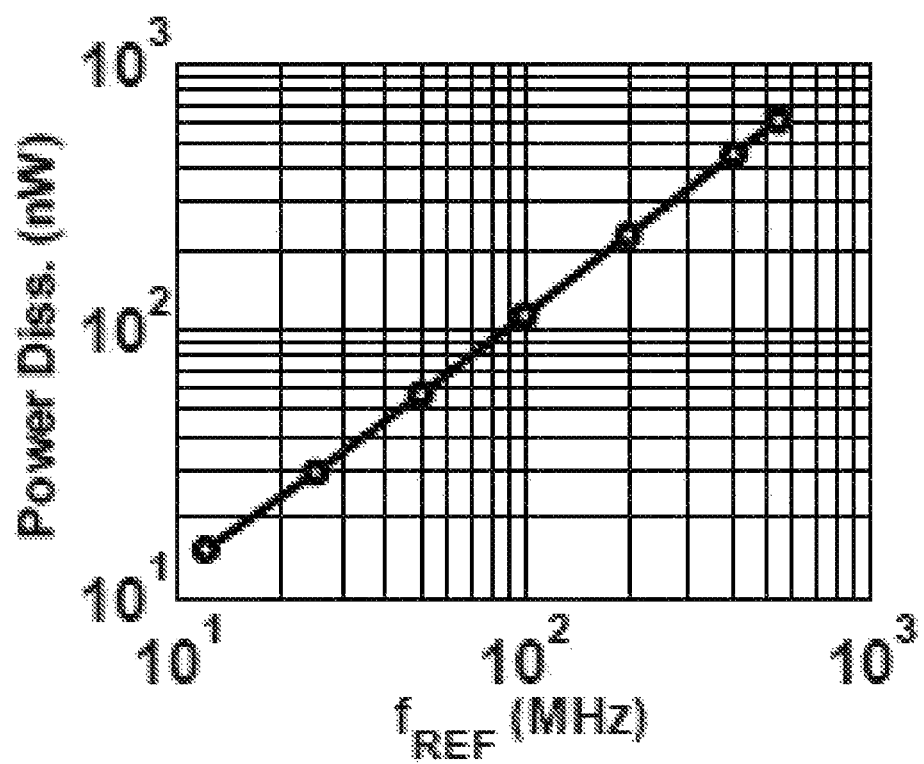
FIG. 18 is a chart showing power dissipation of an example 6-bit DDS.

Furthermore, any digital parts that may be utilized in the processor 100 may use a topology similar to a static CMOS or any other logic family suitable for the given process technology. One example digital block that may be employed with the processor 100 is a DDS 280, as shown in FIG. 17. Each time before a ramp start, a new value of N may be applied to the DDS 280. Output from the DDS 280, which may be the most-significant bit (MSB) of the accumulator, can be sent to all the cells 104. In one example, the output frequency $f_{CLK}$ is equal to $f_{REF} \times N/2^K$, where K is the word-length of the accumulator and where N can be any integer in the $[0, 2^{k-1}]$ range. Further, in some examples, the word-length of the accumulator K may depend on the desired accuracy, while the ratio between the largest and smallest output frequencies (i.e., the largest and smallest weights) may be $2^K-1$. That said, FIG. 18 shows power dissipation of an example 6-bit DDS where N equals 13. When divided by the number of cells, the DDS power dissipation is negligible. The example DDS can operate up to $f_{REF}$=0.54 GHz.

Figure 19:
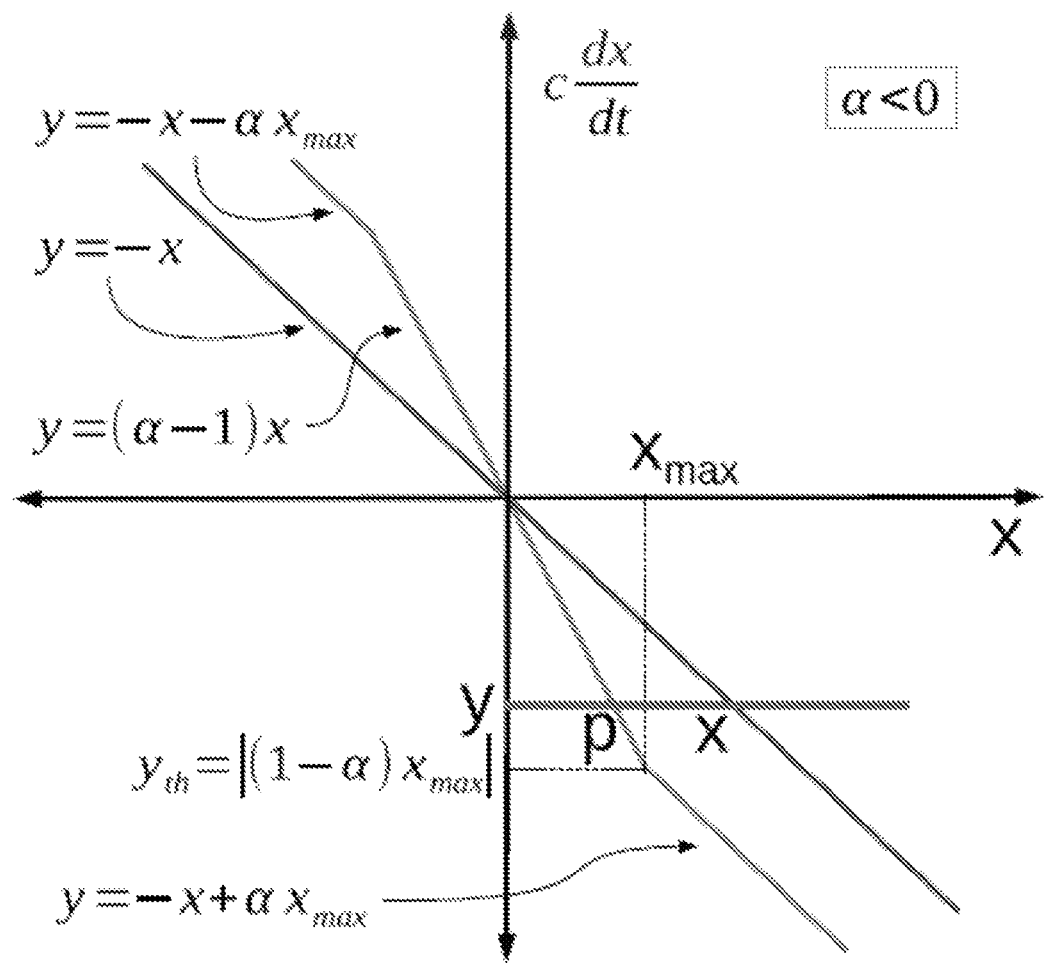
FIG. 19 is a driving point plot for multiple cells, one of which does not include any self-feedback as well as several cells that include self-feedback.

Further, the state of a given cell is provided as feedback current to that cell in many CNN applications. Those having ordinary skill in the art will recognize that the example cell architecture 130 may be augmented so that an equilibrium state voltage can be computed without ever needing to convert a digital state stored in the counter 136 to an analog signal. The impact of self-feedback on CNN computation may be explained with reference to driving point (DP) plots as shown in FIG. 19. In a DP plot, a rate of change of a state variable is plotted against the state variable itself. Therefore, a point where the plot intersects with an x-axis (with a negative slope) represents a state equilibrium voltage. In some examples, the DP plot for a CNN cell can be derived from ordinary differential equations defining its state dynamics. For a given CNN cell with no self-feedback, the corresponding driving point plot becomes a straight line, which is identified as y=−x in FIG. 19. If an additional non-zero self-feedback parameter α is introduced in the cell, the corresponding DP plot assumes a piece-wise linear form, which is identified as y=−x−α $x_{max}$ in FIG. 19. Currents corresponding to inputs and a fixed bias may provide a net constant current that shifts the DP plot vertically, thereby generating intersection points (i.e., equilibrium state voltages). For example, for a vertical shift of y, the corresponding state equilibriums are identified at a point p for a CNN cell with self-feedback, and at a point x for a CNN cell without self-feedback.

The counter of such an example cell may store the net current (e.g., y in FIG. 19). When the self-feedback parameter α=0 (as with y in FIG. 19), the state of the example cell becomes directly proportional to y. In that scenario, the value of the counter can be interpreted as a normalized version of the resulting state of the cell. Where the self-feedback parameter α is nonzero, the proportionality ratio between the counter value and corresponding states of the cell are no longer constant. Where the self-feedback parameter α<0, the equilibrium state voltage p maybe determined based on the following:

$$p = \begin{cases} \dfrac{y}{1-\alpha} & \text{if } 0 < |y| < y_{th} \\ y + \alpha x_{max} & \text{if } y \geq y_{th} \\ y - \alpha x_{max} & \text{if } y \leq -y_{th} \end{cases} \quad \text{(Eq. 8)}$$

Conversely, a similar relationship can be utilized in cases where α>0. With these relationships, it is possible to obtain the final equilibrium state from the counter value. To this end, an additional comparison followed by an addition or multiplication operation may need to be performed. As those having ordinary skill in the art will understand, these operations may be accomplished with the existing hardware along with the aid of one or more logic components. For the multiplication operation, an additional multiplier circuit may be necessary. In short, the example cells 104 of the processor 100 can be used to approximate their final states for propagating types of applications (i.e., templates that include feedbacks from the neighborhood) by allowing the computation to flow from cell to cell in pre-defined paths as determined by application.

Still further, the example processor 100 has been tested through an optimal edge-detection task where edges are identified horizontally by assigning (i) a black color if an edge separates a darker region to its right side from a lighter region to its left side, or (ii) a white color if an edge separates a darker region to its left side from a lighter region to its right side. Using CNN terminology, a template for the task is expressed as follows:

$$A = 0, Z = 0, B = \begin{bmatrix} -0.11 & 0 & 0.11 \\ -0.28 & 0 & 0.28 \\ -0.11 & 0 & 0.11 \end{bmatrix} \quad \text{(Eq. 9)}$$

Figure 20:
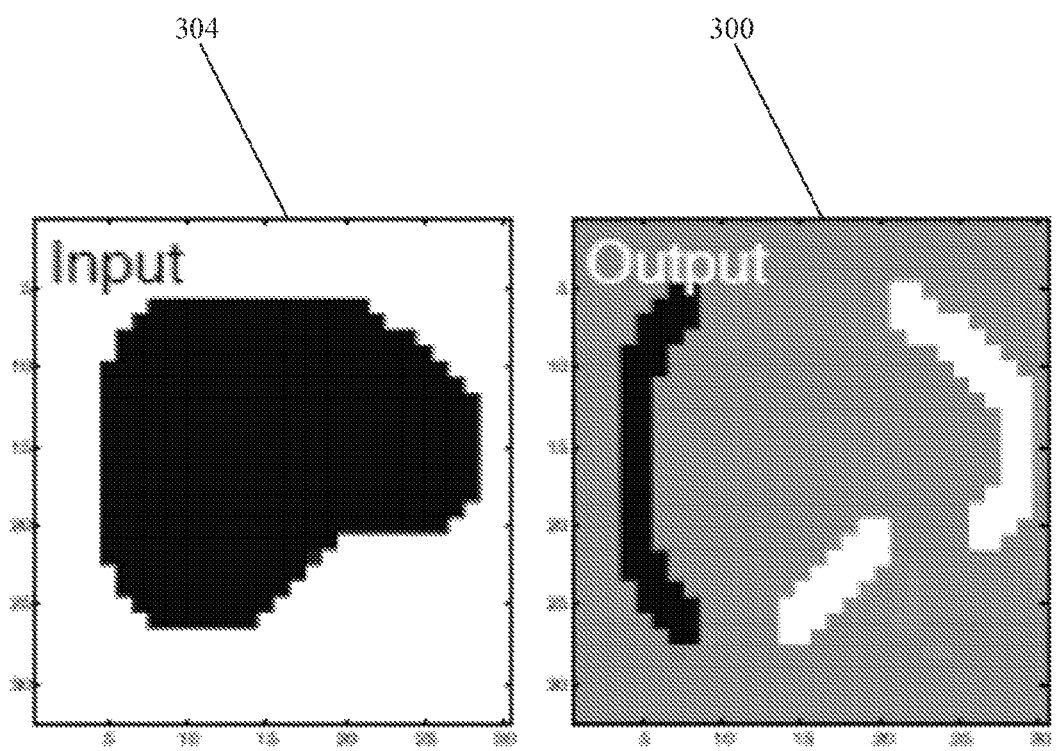
FIG. 20 depicts an input image and an output image that was generated by putting the example processor of FIG. 5 through an edge detection test.
Figure 21:
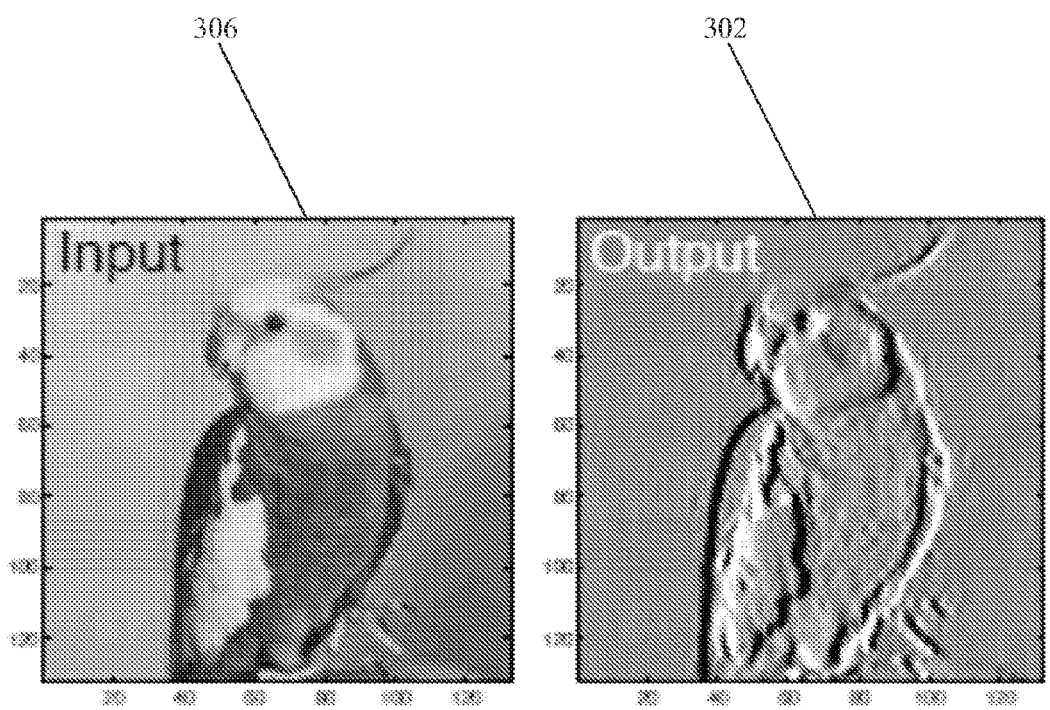
FIG. 21 depicts a second input image and a second output image that was generated by putting the example processor of FIG. 5 through an edge detection test.

Architectural functionality (with differential measurement) was verified via output images 300, 302 shown in FIGS. 20-21. Each pixel of input images 304, 306 shown in FIGS. 20-21 were provided to corresponding CNN cells for processing. All counters were initially reset, and each cell performed three passes of differential measurements (i.e., 6 ramp cycles) to determine final counter values. In the first pass, the operations in the first row of Matrix B (plus offset cancellation) were performed. The second and third passes accounted for the remaining rows of Matrix B. At the end of the test, the counter of each cell held the final result as an 8-bit binary number. In the first and last passes, the DDS was loaded with N=11, whereas in the second pass the DDS was loaded with N=28. At each pass, (i) an output frequency of the DDS ($f_{CLK}=f_{REF}N/2^K$) was determined for the corresponding N; (ii) a weighting factor $w=f_{CLK}/s_{ramp}$ indicative of how many times the counter should have counted for the corresponding row was determined; and (iii) each counter counted $w(u_{k,j-1}-u_{k,j-1})$ times accordingly, where k ∈ {1, 2, 3} accounted for the three rows of Matrix B.

Additional details about this example are given in Table I below.

TABLE I

SPECIFICATIONS OF A CELL FOR EDGE DETECTION

| | |
|---|---|
| DDS | 6-bit with $f_{REF}$ = 360 MHz |
| Ramp | $s_{ramp}$ = 1.0 V/μs, ramping frequency = 1.6 MHz |
| Total time | 3.75 μs (for edge detection) |
| Total operations | 11 (6 multiplications + 5 additions) per cell |
| Input | Analog (full-scale range = 0.32 V) |
| Output | 8-bit (digital) |
| Power supply | Analog: 0.8 V; Digital: 0.4 V |
| Power dissipation† | 0.23 μW per cell |
| Throughput | 2.9 MOPS/cell; 192 GOPS in 256 × 256 network |
| Power efficiency | 12,600 GOPS/W |

†average dissipation of a cell when inputs have uniform distributions.

A ramp having a slope $s_{ramp}$ of 1 V/μs was used. It should be understood that a faster ramp requires GHz clock frequencies for similar accuracy (8-bit output), whereas a slower ramp duration improves the accuracy but lowers the throughput. Although the processor 100 may not necessarily be as flexible as a digital processor in all contexts, the processor 100 has the advantage of having built-in analog-to-digital (A/D) conversion and compact hardware.

Figure 22:
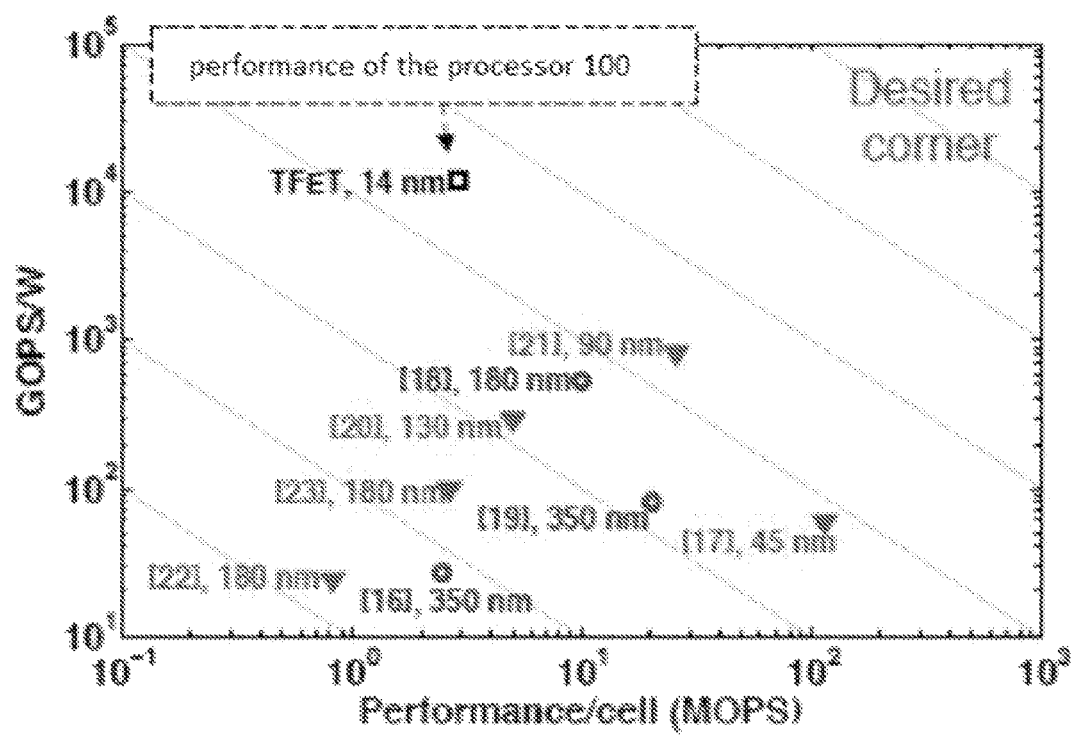
FIG. 22 shows a plot of giga-operations per second per Watt (GOPS/W) versus mega-operations per cell (MOPS) for conventional designs and an example processor of the present disclosure.

Quantitatively, when compared to other conventional (prior processing) architectures, the example processor 100 has modest processing ability (e.g., MOPS) and superior power efficiency (e.g., GOPS/W). As shown in FIG. 22, which plots GOPS/W as a function of MOPS for the processor 100 as well as for certain conventional processors identified numerically as [16]-[23], the processor 100 approaches the desired corner of the graph where both performance and power efficiency are maximized. The conventional processors represented in FIG. 22 include [16] "A General-purpose Processor-per-pixel Analog SIMD Vision Chip" authored by P. Dudek, and P. Hicks and published in IEEE TCAS 1, 52(1) at p. 13-20 (January 2005); [17] "A 530 mV 10-lane SIMD Processor with Variation Resiliency in 45 nm SOI," authored by R. Pawlowski, et al., and published in ISSCC a p. 492-94 (2012); [18] "A 100000 Fps Vision Sensor with Embedded 535GOPS/W 256×256 SIMD Processor Array" authored by S. Carey, et al., and published in Proc. Symp. VLSI Circuits (VLSIC) at p. C182-83 (2013); [19] "ACE16k: The Third Generation of Mixed-signal SIMD-CNN ACE Chips Toward vSoCs" authored by A. Rodriguez-Vazquez, et al., and published in IEEE TCAS-1, 51(5) at p. 851-63 (May 2004); [20]"24-GOPS 4.5-mm Digital Cellular Neural Network for Rapid Visual Attention in an Object Recognition SOC" authored by S. Lee, et al., and published in IEEE Trans. Neural Netw. vol. 22, no. 1 at p. 64-73 (January 2011); [21] "SCDVP: A Simplicial CNN Digital Visual Processor" authored by M. Di Fednferico, et al., and published in IEEE TCAS-I, 61(7) at p. 1962-9 (2014); [22] "A Programmable SIMD Vision Chip for Real-time Vision Applications" authored by W. Miao, et al., and published in IEEE J. Solid-State Cu, 43(6) at p. 1470-9 (June 2008); and [23] "A Programmable Vision Chip Based on Multiple Levels of Parallel Processors" authored by W. Zhang, et al., and published in IEEE JSSC, 46(9) at p. 2132-47 (2011)—all of which are hereby incorporated by reference in their entireties. The processor 100 is represented by a square (□), whereas the existing digital and analog implementations are represented by triangles (▼) and circles (○).

The processor 100 exploits the unique properties of HomFETs and can attain power efficiencies of at least 10,000 GOPS/W. Once increases in on-current $I_{on}$ occur (without degrading an off-current $I_{off}$), clock frequency and throughput will improve and power efficiency may extend well beyond 10,000 GOPS/W.

Further, it should be understood that the processor 100 may also require and/or utilize additional hardware beyond the specific features disclosed herein. Likewise, it should be understood that the example processor 100 need not necessarily include each and every hardware feature shown in the figures and described herein. Finally, the publication entitled "A CNN-inspired Mixed Signal Processor Based on Tunnel Transistors" authored by B. Sedighi, et al., and published in Proceedings of the 2015 Design, Automation & Test In Europe Conference & Exhibition at p. 1150-1155 (2015) is hereby incorporated by reference in its entirety.

We claim:

1. A processor including a homogenous array of cells, with each of the cells capable of receiving an analog input, communicating with adjacent cells, and producing a digital output, each of the cells comprising:
    a comparator;
    a first input to the comparator that includes a voltage ramp that is shared by the homogenous array of cells and is applied to the first input in a recurring manner;
    a second input to the comparator, the second input alternating between a reference voltage and an analog input voltage, wherein the comparator generates an output voltage based on a comparison of at least two of the voltage ramp, the reference voltage, and the analog input voltage;
    an AND gate in each of the cells wherein an output of the AND gate comprises a pulse signal, the AND gate receiving as input the output voltage of the comparator and a logic signal, wherein the output voltage of the comparator, the logic signal, and the pulse signal are, respectively, only capable of a high-level and a low-level, wherein the logic signal is set to a high-level only when the voltage ramp is applied to the first input of the comparator, wherein the pulse signal is set to a high-level only when both the output voltage of the comparator and the logic signal are set to their respective high-levels;
    a logic unit with an input signal from each of the adjacent cells, where the input signal is the pulse signal of the adjacent cell, and an additional input signal which is the pulse signal of the present cell, and with an output voltage which corresponds to an aggregate of the input signals; and
    a gated counter for measuring pulse-widths of a signal that is based at least in part on the output signal of the logic unit, a digital output of the gated counter reflecting information about a output voltage of the logic unit.

2. The processor of claim 1, wherein a plurality of transistors in the comparator of each of the cells are homo-junction tunnel field effect transistors.

3. The processor of claim 2, wherein indium-arsenide is used a source material for the plurality of homo-junction tunnel field effect transistors in the comparator of each of the cells.

4. The processor of claim 2, wherein the comparator of each of the cells comprises a differential input stage and a common-source output stage.

5. The processor of claim 1, further comprising a control unit that determines whether the reference voltage or the analog input voltage is supplied to the comparator of each of the cells.

6. The processor of claim 1, further comprising a frequency synthesizer for altering a clock frequency of the gated counter in each of the cells.

7. The processor of claim 6, wherein the frequency synthesizer is a direct-digital frequency synthesizer shared by all of the cells.

8. The processor of claim 1, further comprising a ramp generator for producing the voltage ramp, wherein operation of the ramp generator involves charging a capacitor by a fixed current.

9. The processor of claim 1, wherein each of the cells further comprises circuitry for providing self-feedback regarding a digital state stored in the counter.

10. A processor for conditioning analog signals, the processor comprising: an array of cells, with each of the cells comprising:
    a comparator including a plurality of transistors using indium-arsenide as a source material;
    a first input to the comparator that includes a voltage ramp;
    a second input to the comparator, the second input alternating between a reference voltage and an analog input voltage, wherein the comparator generates an output voltage based on a comparison of the voltage ramp with either the reference voltage or the analog input voltage;
    an AND gate in each of the cells with a pulse signal which is an output of the AND gate, the AND gate receiving as input the output voltage of the comparator and a logic signal, wherein the output voltage of the comparator, the logic signal, and the pulse signal are, respectively, only capable of a high-level and a low-level, wherein the logic signal is set to a high-level only when the voltage ramp is applied to the first input of the comparator, wherein the pulse signal is set to a high-level only when both the output voltage of the comparator and the logic signal are set to their respective high-levels;
    a logic unit with an input signal from each of the adjacent cells, where the input signal is the pulse signal of that cell, and an additional input signal which is the pulse signal of the present cell, and with an output voltage which corresponds to an aggregate of the input signals; and
    a gated counter for measuring pulse-widths of a signal that is based at least in part on the output signal of the logic unit, a digital output of the gated counter reflecting information about a output voltage of the logic unit;
    a direct-digital frequency synthesizer for generating a variable clock frequency used in the gated counter of each of the cells, the variable clock frequency affecting the manner in which the gated counter measures the pulse-widths of the signal;
    a ramp generator for generating and applying the voltage ramp to the comparator of each of the cells, the ramp generator including at least one capacitor that is charged by a fixed current;
    and a control unit that determines whether the reference voltage or the input voltage is supplied to the comparator of each of the cells.

11. The processor of claim 1, wherein the output signal of the logic unit is calculated as a weighted summation of the input signals.

12. The processor of claim 11 where the weighted summation is determined by a ratio of the clock frequency and a slope of the voltage ramp.

13. The processor of claim 11 where the logic unit functions as a multiplexer.

14. The processor of claim 1, wherein the output signal of the logic unit is calculated as a differential between two of the input signals.

15. The processor of claim 10, wherein the output signal of the logic unit is calculated as a weighted summation of the input signals.

16. The processor of claim 15 where the weighted summation is determined by a ratio of the clock frequency and a slope of the voltage ramp.

17. The processor of claim 10, wherein the output signal of the logic unit is calculated as a differential between two of the input signals.

* * * * *